United States Patent [19]

Kawada et al.

[11] 4,284,939
[45] Aug. 18, 1981

[54] DEVICE FOR DETECTING OPPOSITE PHASE AND OPEN PHASE

[75] Inventors: Shigeki Kawada; Yoshiki Fujioka; Naoto Ohta, all of Hino; Yutaka Koiwai, Tokyo, all of Japan

[73] Assignee: Fujitsu Fanuc Limited, Hino, Japan

[21] Appl. No.: 76,548

[22] Filed: Sep. 18, 1979

[30] Foreign Application Priority Data

Sep. 30, 1978 [JP] Japan .................. 53-119899

[51] Int. Cl.³ .................................... G05B 5/00
[52] U.S. Cl. ........................... 318/453; 361/77
[58] Field of Search ............ 361/23, 30, 33, 76, 361/77; 318/453

[56] References Cited

U.S. PATENT DOCUMENTS

| | | | |
|---|---|---|---|
| 3,155,880 | 11/1964 | Salina | 361/33 |
| 3,551,748 | 12/1970 | Maynard | 361/76 |
| 3,629,713 | 12/1971 | Szpilka | 361/76 |
| 3,727,103 | 4/1973 | Finch et al. | 361/30 |
| 3,824,430 | 7/1974 | Hentschel | 361/23 |
| 4,084,205 | 4/1978 | Bohnert | 361/77 |
| 4,199,798 | 7/1980 | Leppke et al. | 361/76 |

*Primary Examiner*—David Smith, Jr.
*Attorney, Agent, or Firm*—Armstrong, Nikaido, Marmelstein & Kubovcik

[57] ABSTRACT

A device for detecting opposite phases and an open phase in an input three-phase voltage for a DC motor, wherein the input three-phase voltage is rectified by a three-phase bridge circuit and supplied to the armature of the DC motor. The input three-phase voltage is supplied to the three-phase bridge circuit when the maximum level is equal to or less than the reference voltage, while the input three-phase voltage is not supplied to the bridge circuit when the maximum level is greater than the reference voltage. In this case, both opposite phases and an open phase can be detected by using a common device. In addition, only two phases, such as U- and W-phases, are used for detecting opposite phases and an open phase no matter how these phases may be generated in any phase such as U-, V- or W-phase of the input three-phase voltage. As a result, the device is small in size, simple in electrical construction and low in cost.

4 Claims, 3 Drawing Figures

DEVICE FOR DETECTING OPPOSITE PHASE AND OPEN PHASE

The present invention relates generally to a device for detecting both opposite phases and an open phase (a defective phase) and, more particularly, to a device for detecting opposite phases and an open phase in a three-phase voltage which is used for driving a DC motor, wherein the three-phase voltage is rectified by a three-phase bridge circuit and supplied to the armature of the DC motor.

One type of a three-phase bridge circuit used for driving the DC motor is, for example, a three-phase anti-parallel bridge circuit comprising a bridge circuit formed by six thyristors for supplying forward current to the DC motor and another bridge circuit formed by six thyristors for supplying backward current to the DC motor, wherein these bridge circuits are connected anti-parallel to each other. The three-phase anti-parallel bridge circuit which is controlled by firing pulses generated from a gate circuit has such an advantage that the return of energy from the DC motor to the main circuit and the reverse rotation of the DC motor can be effected without change-over contacts. If opposite phases, which cause the phase rotation to reverse, or an open phase are generated in a three-phase voltage applied to the three-phase bridge circuit, firing pulses generated from the gate circuit go out of control causing an excess of current to flow through the armature of the DC motor. As a result, the DC motor and the thyristors may be damaged. In addition, if the DC motor includes permanent magnets, the magnetic field intensity of the magnets may be weakened. Therefore, in order to avoid the above-mentioned damages, it is required to detect opposite phases and an open phase in the three-phase voltage applied to the three-phase bridge circuit and, after that, to shut off the main circuit or the gate circuit.

The prior art device for detecting opposite phases and an open phase comprises a part for detecting opposite phases and a part for detecting an open phase, seperately, in each phase of the three-phase voltage. As a result, this detecting device is relatively large in size, complex in electrical construction and high in cost.

Therefore, it is a principal object of the present invention to provide a device for detecting opposite phases and an open phase in a three-phase voltage which is small in size, simple in electrical construction and low in cost.

According to the present invention, there is provided a device for detecting opposite phases and an open phase in an input three-phase voltage for a DC motor, wherein the input three-phase voltage is rectified by a three-phase bridge circuit and supplied to the armature of the DC motor, comprising: a first means for producing a first voltage which lags one phase, for example U-phase of the input three-phase voltage by a phase angle of 60°; a second means for producing a second voltage which lags another phase, for example, W-phase, which leads U-phase by a phase angle of 240°, by a phase angle of 180°; a third means for producing a difference between the first and second voltages; means for comparing the maximum level of the difference voltage with a reference voltage, and; means for supplying the input three-phase voltage to the three-phase bridge circuit. In this device, the input three-phase voltage is supplied to the three-phase bridge circuit when the maximum level is equal to or less than the reference voltage, while the input three-phase voltage is not supplied to the bridge circuit when the maximum level is greater than the reference voltage. In this case, both opposite phases and an open phase can be detected by using a common device. In addition, only two phases, such as U- and W-phases, are used for detecting opposite phases and an open phase no matter how these phases may be generated in any phase such as U-, V- or W-phase of the input three-phase voltage. As a result, the device according to the present invention is small in size, simple in electrical construction and low in cost.

The present invention will be more clearly understood from the following description with reference to the accompanying drawings.

Figure 1:
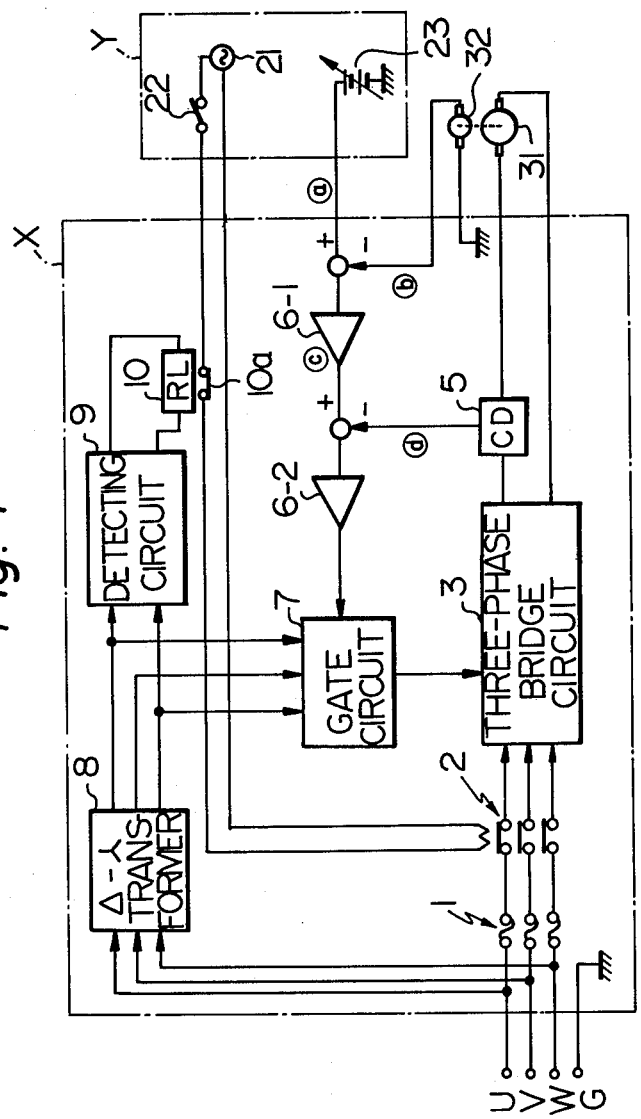
FIG. 1 is a block diagram illustrating the apparatus for driving a DC motor including an embodiment of the detecting circuit of the present invention.

Referring to FIG. 1, an apparatus X for driving a DC motor 31 can be operated by a manual handling part Y. In the apparatus X, a main circuit for supplying a three-phase voltage (U, V and W) to the DC motor 31 is composed of fuses 1, magnetic contactors 2 connected to the fuses 1 and a three-phase bridge circuit 3 such as a three-phase anti-parallel bridge circuit whose DC output is applied to the armature of the DC motor 31. In order to initiate the rotation of the DC motor 31, a velocity indicator 23 (the part Y) is set to a desired value so that the indicator 23 produces a velocity indication signal "a". After that, a switch 22 is turned on so that an AC power supply 21 is applied to the magnetic contactors 2. As a result, the magnetic contactors 2 are closed. The rotation velocity of the DC motor 31 is controlled as follows. As a first step, a difference voltage between the voltage of the velocity indication signal "a" and that of a velocity feedback signal "b" generated from a tacho-generator 32 associated with the DC motor 31 is amplified by an amplifier 6-1. As a second step, a difference voltage between the voltage of a current indication signal "c" generated from the amplifier 6-1 and that of a current feedback signal "d" generated from a current detector 5, which is arranged between the three-phase bridge circuit 3 and the DC motor 31, is amplified by an amplifier 6-2. As the last step, a gate circuit 7 which is controlled by a signal generated from the amplifier 6-2 produces firing pulses to the gates of the three-phase bridge circuit 3 in synchronization with a Δ-Y synchronous transformer 8. In the apparatus X, a detecting circuit 9 for detecting opposite phases and an open phase is connected to two phases, for example, U- and W- phases of the Δ-Y synchronous transformer 8. When the circuit detects opposite phases or an open phase in the input three-phase voltage, the circuit 9 activates a relay 10 so that the relay contact 10a is opened. As a result, the magnetic contactors 2 are opened so that the three-phase voltage (U, V and W) is not applied to the three-phase bridge circuit 3. Next, the detecting circuit 9 will be explained in detail.

Figure 2:
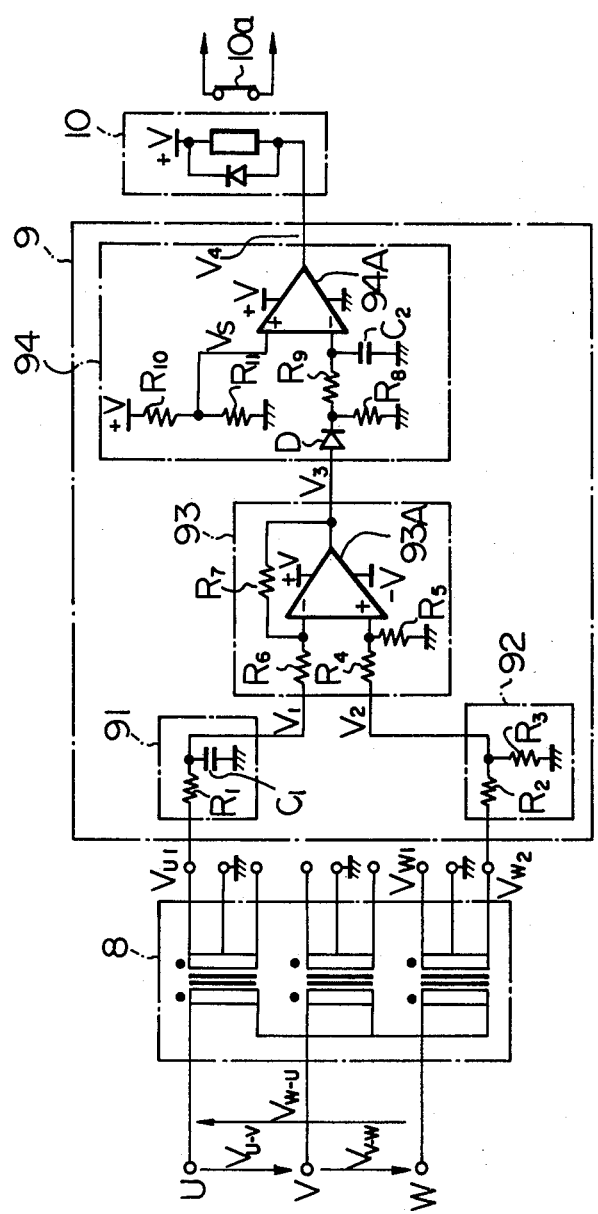
FIG. 2 is a detailed circuit diagram of the detecting circuit 9 of FIG. 1.

FIG. 2 is a detailed circuit diagram of the detecting circuit 9 of FIG. 1. In FIG. 2, the detecting circuit 9 comprises a phase shifter 91 which shifts the U-phase voltage $V_{u1}$ by a phase angle of 60°, a voltage divider 92 which divides the voltage $V_{w2}$ which lags the W-phase voltage $V_{w1}$ by a phase angle of 180°, a differential amplifier 93 for producing a difference voltage between a voltage $V_1$ generated from the phase shifter 91 and a voltage $V_2$ generated from the voltage divider 92, and a comparator 94 for comparing the difference voltage $V_3$ with a reference voltage $V_s$. The phase shifter 91 is composed of a resistor $R_1$ and a capacitor $C_1$ whose values are preset in order to shift the voltage $V_{u1}$ whose frequency is, for example, 55 Hz. The voltage divider 92 is composed of two resistors $R_2$ and $R_3$ whose values are preset so that the maximum level of the voltage $V_1$ produced by the phase shifter 91 can coincide with that of the voltage $V_2$ produced by the voltage divider 92. The differential amplifier 93 is composed of an operational amplifier 93A and resistors $R_4$, $R_5$, $R_6$ and $R_7$ whose values are preset to be, for example, $R_5/(R_4+R_5)=R_7/(R_6+R_7)$. In this case, the voltage $V_3$ is as follows.

$$V_3 = \frac{R_5}{R_4} (V_2 - V_1) \tag{1}$$

The comparator 94 is composed of: an operational amplifier 94A; a rectifier circuit formed by a diode D and a resistor $R_8$; a smoothing circuit formed by a resistor $R_9$ and a capacitor $C_2$, and two resistor $R_{10}$ and $R_{11}$ for determining the voltage $V_s(=VR_{10}/(R_{10}+R_{11}))$.

In FIG. 2, when the voltages $V_1$ and $V_2$ as vectors are about the same, the maximum level of the voltage $V_3$ shown in the equation (1) is nearly zero. As a result, the output level $V_4$ of the comparator 94 becomes high so that the relay 10 is not activated. On the contrary, when the voltages $V_1$ and $V_2$ as vectors are different, the maximum level of the voltage $V_3$ shown in the equation (1) is high. As a result, the output level $V_4$ of the comparator 94 becomes low so that the relay 10 is activated and the relay contact 10a is opened.

The operation of the detecting circuit 9 of FIG. 2 will be explained in more detail.

Figure 3A:
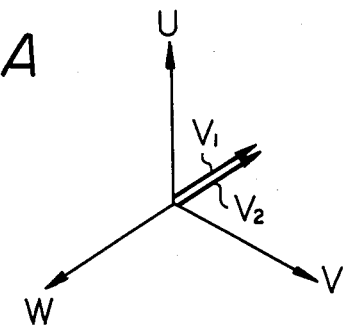
FIGS. 3A through 3C are vector diagrams for explaining the operation of the detecting circuit 9 of FIG. 2.
Figure 3B:
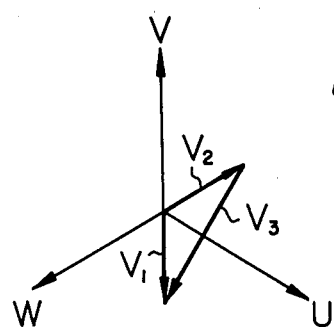
Figure 3C:
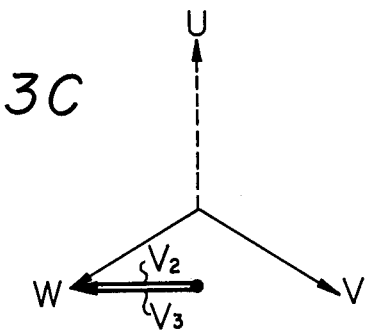

FIGS. 3A through 3C are vector diagrams for explaining the operation of the detecting circuit 9. Consider the case as illustrated in FIG. 3A wherein the input three-phase voltage including U-, V- and W-phases is in a normal state. In this case, the line voltages $V_{u-v}$, $V_{v-w}$ and $V_{w-u}$ are as follows.

$$V_{u-v} = V_{m1} \sin \omega t \tag{2}$$

$$V_{v-w} = V_{m1} \sin \left( \omega t + \frac{2}{3} \pi \right) \tag{3}$$

$$V_{w-u} = V_{m1} \sin \left( \omega t + \frac{4}{3} \pi \right) \tag{4}$$

where $V_{m1}$ is a constant. In addition, the voltages $V_{u1}$ and $V_{w2}$ generated from the $\Delta$-Y synchronous transformer 8 are as follows.

$$V_{u1} = V_{m2} \sin \left( \omega t + \frac{7}{6} \pi \right) \tag{5}$$

$$V_{w2} = V_{m2} \sin \left( \omega t + \frac{3}{2} \pi \right) \tag{6}$$

where $V_{m2}$ is a constant. The voltage $V_1$ generated from the phase shifter 91 is obtained by shifting the voltage $V_{u1}$ of the equation (5). Therefore, $$V_1 = \frac{\frac{1}{\omega c_1}}{\sqrt{R_1^2 + \left(\frac{1}{\omega c_1}\right)^2}} V_{m2} \sin \left( \omega t + \frac{7}{6} \pi + 0.324\pi \right) \tag{7}$$

where
0.324$\pi$: a phase shift ($\delta = \tan^{-1} \omega C_1 R_1$)
w: $2\pi \times 55$(Hz).

In this case, the phase shifter 91 is commonly used for the two commercial frequencies 50 Hz and 60 Hz. On the other hand, the voltage $V_2$ generated from the voltage divider 92 is the same as the voltage $V_{w2}$ in the equation (6), except for the proportional constant, as follows.

$$V_2 = \frac{R_3}{R_2 + R_3} V_{m2} \sin \left( \omega t + \frac{3}{2} \pi \right) \tag{8}$$

Therefore, the output voltage $V_3$ of the differential amplifier 93 is obtained by using the equations (1), (7) and (8).

$$V_3 = 0.028 \, A \, V_{m2} \sin (\omega t + \pi) \tag{9}$$

where $$A = \frac{\frac{1}{\omega c_1}}{\sqrt{R_1^2 + \left(\frac{1}{\omega c_1}\right)^2}} = \frac{R_3}{R_2 + R_3} \tag{10}$$

In other words, if the resistors $R_2$ and $R_3$ satisfy the equation (10), the maximum level of the voltage $V_1$ coincides with that of the voltage $V_2$. As a result, since the maximum level of the voltage $V_3$ is very small and neglible, the output voltage $V_4$ of the comparator 94 becomes high so that the relay 10 is not activated. Thus, when the input three-phase voltage is in a normal state, the relay 10 is not activated so that the magnetic contactors 2 (FIG. 1) remain in a closed state. This case corresponds to FIG. 3A in which the voltage $V_3$ is so small that the vector $V_3$ is not illustrated.

Now, consider the case wherein opposite phases are generated. For example, assume that U- and V-phases of the input three-phases are changed in relation to each other. This case corresponds to FIG. 3B. In this case, the voltages $V_{u1}$ and $V_{m2}$ are as follows.

$$V_{u1} = V_{m2} \sin \left( \omega t - \frac{\pi}{6} \right) \tag{11}$$

$$V_{w2} = V_{m2} \sin \left( \omega t + \frac{3}{2} \pi \right) \tag{12}$$

Therefore,
$$V_1 = A \, V_{m2} \sin (\omega t + 0.157\pi) \tag{13}$$

$$V_2 = A \, V_{m2} \sin \left( \omega t + \frac{3}{2} \pi \right) \tag{14}$$

Then, the output voltage $V_3$ of the differential amplifier 93 is obtained by using the equations (1), (13) and (14).

$$V_3 = 1.71 \, A \, V_{m2} \sin (\omega t + 0.33\pi) \tag{15}$$

In the case wherein V- and W-phases are changed in relation to each other, the equation (15) is replaced by $$V_3 = 1.72 \, A \, V_{m2} \sin(\omega t - 0.34\pi) \tag{15'}$$

Further, in the case wherein W- and U- phases are changed in relation to each other, the equation (15) is replaced by $$V_3 = -1.72 \, A \, V_{m2} \sin \omega t \tag{15''}$$

As can be understood from the equations (9), (15), (15)' and (15)", if any two phases of U-, V- and W-phases of the input three-phase voltage are changed in relation to each other, the maximum level of the output voltage $V_3$ of the differential amplifier 93 becomes very large.

Next, consider the case wherein an open phase is generated. For example, assume that U-shape of the input three-phase voltage is opened. This case corresponds to FIG. 3C. In this case, the voltages $V_{u1}$ and $V_{w2}$ are as follows.

$$V_{u1} = 0 \tag{16}$$

$$V_{w2} = \sqrt{\tfrac{3}{2}} \, V_{m2} \sin\left(\omega t + \tfrac{2}{3}\pi\right) \tag{17}$$

Therefore, $$V_1 = 0 \tag{18}$$

$$V_2 = 0.866 \, A \, V_{m2} \sin\left(\omega t + \tfrac{2}{3}\pi\right) \tag{19}$$

Then, the output voltage $V_3$ of the differential amplifier 93 is obtained by using the equations (1), (18) and (19), as follows.

$$V_3 = 0.866 \, A \, V_{m2} \sin\left(\omega t + \tfrac{2}{3}\pi\right) \tag{20}$$

In the case wherein the V-phase is opened, the equation (20) is replaced by $$V_3 = 0.866 \, A \, V_{m2} \sin\left(\omega t + \tfrac{2}{3}\pi\right) \tag{20'}$$

Further, in the case wherein the W-phase is opened, the equation (20) is replaced by $$V_3 = 0.866 \, A \, V_{m2} \sin(\omega t + 0.324\pi) \tag{20''}$$

As can be understood from the equations (9), (20), (20)' and (20)', if any one phase of U-, V- and W-phases is opened, the maximum level of the output voltage $V_3$ of the differential amplifier 93 becomes very large. Thus, the maximum level of the voltage $V_3$ is $0.028 \times A \, V_{m2}$
in case of a normal state, $(1.71 \sim 1.72) \times A \, V_{m2}$
in case of opposite phase, and $(0.858 \sim 0.866) \times A \, V_{m2}$
in case of an open phase.

Therefore, the reference voltage $V_s$ is set between the value $0.028 \times A \, V_{m2}$ and the value $0.858 \, A \, V_{m2}$ so that both opposite phases and an open phase can be detected by the comparator 94. In other words, when opposite phases or an open phase is generated, the output voltage $V_4$ of the comparator 94 becomes low so that the relay 10 is activated. On the other hand, when neither opposite phases nor an open phase is generated, the output voltage $V_4$ becomes high so that the relay 10 is not activated.

As has been mentioned above, the phase shifter 91 is commonly used for the commercial frequencies 50 Hz and 60 Hz. However, it should be noted that the phase shifter 91 can be manufactured only for a special frequency. In this case, the maximum level of the voltage $V_3$ is 0
in case of a normal state, $1.72 \times A \, V_{m2}$
in case of opposite phases, and $0.866 \times A \, V_{m2}$
in case of an open phase.

As a result, the reference voltage $V_s$ is set between the values 0 and $0.866 \, A V_{m2}$.

As explained hereinbefore, the detecting device according to the present invention has the advantages, as compared with those of the prior art, that the device is small in size, simple in electrical construction and low in cost, because the detecting device is connected to only two phases of the input three-phase voltage and is commonly used for detecting both opposite phases and an open phase.

What is claimed is:

1. A device for detecting opposite phases and an open phase in an input three-phase voltage for driving a DC motor, wherein said input three-phase voltage is rectified by a three-phase bridge circuit having a DC output supplied to the armature of said DC motor, wherein said input three-phase voltage is supplied to a Δ-Y transformer and the outputs of said transformer are connected to a gate circuit for generating firing pulses to said three-phase bridge circuit, said device comprising:
    a first phase shifter connected to a first output of said Δ-Y transformer, for producing a first voltage which lags a first phase of said input three-phase voltage by a phase angle of 60°;
    a second phase shifter connected to a second output of said Δ-Y transformer, for producing a second voltage which lags a second phase of said input three-phase voltage by a phase angle of 180°, said second phase leading said first phase by a phase angle of 240°;
    a differential amplifier connected to outputs of said first phase shifter and said second phase shifter for producing a difference voltage therebetween;
    comparator means connected to said differential amplifier for comparing the maximum level of said difference voltage with a reference voltage; and
    controller means connected between said comparator means and the input side of said three-phase bridge circuit for controlling the application of said input three-phase voltage to said three-phase bridge circuit, such that said input three-phase voltage is applied to said three-phase bridge circuit only when the maximum level of said difference voltage is equal to or smaller than said reference voltage.

2. A device as set forth in claim 1 wherein said first phase shifter includes a resistor and a capacitor connected in series, the connecting point of said resistor and said capacitor producing said first voltage, and said second phase shifter comprises a voltage divider circuit wherein the dividing ratio of said voltage divider circuit is determined in order to adjust the maximum level of said second voltage to coincide with that of said first voltage.

3. A device as set forth in claim 1 wherein said comparator means includes:

a rectifier circuit which receives said difference voltage;

a smoothing circuit for smoothing the output signal of said rectifier circuit, connected to said rectifier circuit; and an operational amplifier having inputs for receiving a DC output signal of said smoothing circuit and said reference voltage, respectively, and an output coupled to said controller means for providing a signal having a level dependent upon the magnitude of the output signal of said smoothing circuit compared with said reference voltage.

4. A device as set forth in claim 1 wherein said controller means includes:

a relay having a coil activated by the output signal of said comparing means; and magnetic contactors connected to the contact of said relay and arranged between said input three-phase voltage and said three-phase bridge circuit, wherein said magnetic contactors are closed to supply said input three-phase voltage to said three-phase bridge circuit when said relay coil is activated, and said magnetic contactors are opened so that said input three-phase voltage is not supplied to said three-phase bridge circuit when said relay coil is not activated.

* * * * *